United States Patent [19]

Suwa

[11] Patent Number: 4,611,261
[45] Date of Patent: Sep. 9, 1986

[54] ELECTRONIC EQUIPMENT

[75] Inventor: Kaname Suwa, Yokohama, Japan

[73] Assignee: Canon Kabushiki Kaisha, Tokyo, Japan

[21] Appl. No.: 532,092

[22] Filed: Sep. 14, 1983

[30] Foreign Application Priority Data

Sep. 21, 1982 [JP] Japan ............... 57-163167
Sep. 21, 1982 [JP] Japan ............... 57-163168
Sep. 21, 1982 [JP] Japan ............... 57-163169

[51] Int. Cl.$^4$ ............................... H05K 1/18
[52] U.S. Cl. ................... 361/399; 174/68.5; 200/5 A; 200/159 B
[58] Field of Search ........ 361/399; 174/68.5; 364/708; 200/5 A, 159 B

[56] References Cited

U.S. PATENT DOCUMENTS

| | | | |
|---|---|---|---|
| 3,643,041 | 2/1972 | Jackson | 200/5 A |
| 3,732,390 | 5/1973 | Novak | 200/159 B X |
| 3,971,902 | 7/1976 | Wulf et al. | 200/5 A |
| 3,996,429 | 12/1976 | Chu et al. | 200/159 A X |
| 4,065,651 | 12/1977 | Erni et al. | 200/159 B X |
| 4,317,012 | 2/1982 | Itoh | 200/5 A |
| 4,328,399 | 5/1982 | Perks et al. | 174/68.5 X |
| 4,365,168 | 12/1982 | Chaput et al. | 200/5 A X |
| 4,366,355 | 12/1982 | Oelsch | 200/5 A X |
| 4,395,817 | 8/1983 | Asada et al. | 200/5 A X |

Primary Examiner—R. R. Kucia
Attorney, Agent, or Firm—Fitzpatrick, Cella, Harper & Scinto

[57] ABSTRACT

An electronic equipment comprises key input means having a plurality of key input areas, a frame member for sandwiching a metal plate therein, and printed circuit means having a key input circuit adapted to be closed by a depression force from the key input area and having an electronic part connected thereto. The key input means covers an upper surface of the frame member. The frame member has convey means for conveying the depression force from the key input area to the printed circuit means.

6 Claims, 8 Drawing Figures

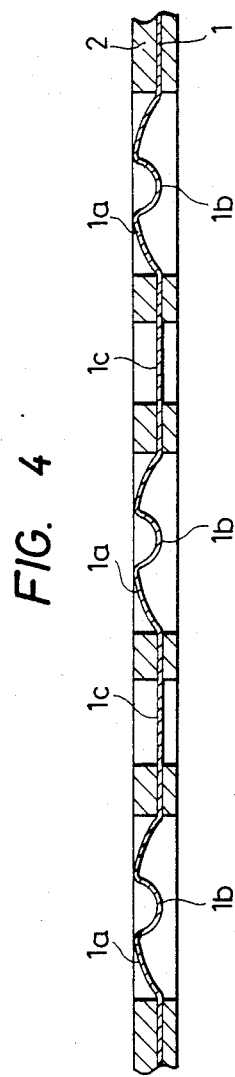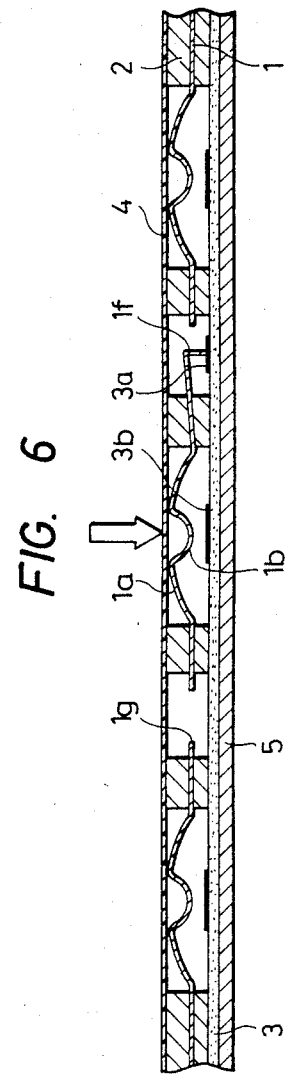

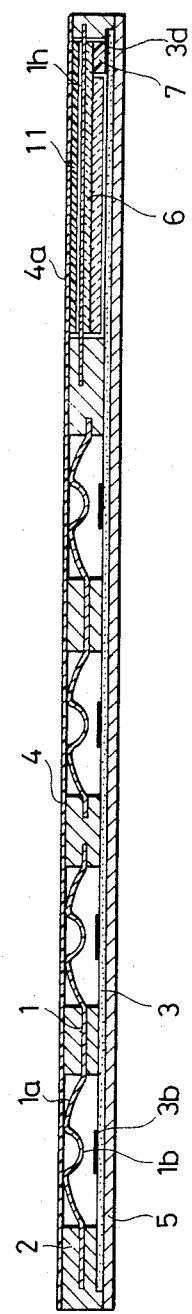
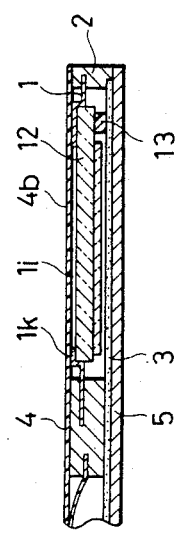
FIG. 7
FIG. 8

ELECTRONIC EQUIPMENT

BACKGROUND OF THE INVENTION

1. Field of the Invention

The present invention relates to electronic equipment, and more particularly to electronic equipment having a plurality of key input units such as an electronic desk-top calculator.

2. Description of the Prior Art

In prior art electronic equipment of this type, a key input unit comprises movable contacts formed by conductive rubber and key tops, and a printed circuit board arranged on the movable contacts. A separate display unit and a separate unit for accommodating a power supply such as batteries are held by separate members.

Because of such construction, the number of parts is large and the number of assembling steps is also large and associated management requirements such as parts management are complex. As a result, the cost of the equipment increases.

A thin desk-top calculator has been recently marketed but it is weak in strength because of thin structure.

In a key input unit of the prior art desk-top calculator, stationary contacts for key input are formed on a printed circuit board in a predetermined pattern. Movable contacts made of silicone conductive rubber are vertically movably held at positions facing the pattern, and separate key tops are arranged on the movable contacts.

With such a structure, the conductive rubber of the movable contacts is separate from a frame and it must be mounted at a predetermined position in an assembling step. Further, a plurality of separate key tops must be fitted to key top holes formed in the frame. If the frame is upset or vibrated during the assembling step, the key tops are scattered here and there. Thus, the number of steps increases and the handling is very troublesome.

When a thin desk-top calculator which is convenient to carry is desired, there is a limit to the thickness of the silicone rubber. It is difficult to provide a click feeling with a short key stroke and this may cause misoperation.

SUMMARY OF THE INVENTION

It is an object of the present invention to provide electronic equipment having a key input function which is new in structure and effective.

It is another object of the present invention to assure a sufficient strength of electronic equipment when it is constructed in a thin structure.

It is other object of the present invention to enhance the strength and simplify the structure of electronic equipment by insert molding.

It is other object of the present invention to facilitate insert molding of a metal plate.

It is other object of the present invention to use a projection of a metal plate formed by insert molding in order to hold an electronic part.

It is other object of the present invention to provide a projection formed by insert molding as a contact.

It is other object of the present invention to form a key input unit very easily.

It is other object of the present invention to use contact means to hold a part.

It is other object of the present invention to simply form a key input unit by insert molding.

It is other object of the present invention to allow a metal plate formed by insert molding in a frame to be positioned at a predetermined position so that a variation of position of the metal plate between one frame and another frame is eliminated.

It is other object of the present invention to hold a thick part such as a display or a solar cell by a metal plate.

It is other object of the present invention to form closing means by insert molding when a metal plate having a portion for forming the closing means is formed in a frame by insert molding.

It is other object of the present invention to simultaneously form closing means and a projection for holding a part by insert molding.

It is other object of the present invention to simultaneously form closing means and a contact to be contacted to printed circuit means by insert molding.

It is other object of the present invention to exactly form a metal plate by insert molding.

It is other object of the present invention to provide a very thin electronic equipment.

The other objects of the present invention will be apparent from the following description of the invention.

BRIEF DESCRIPTION OF THE DRAWINGS

FIG. 4 is an enlarged sectional view taken along a line A—A of FIG. 3, FIG. 6 is a partially enlarged longitudinal sectional view during an assembling step, FIG. 7 is an enlarged sectional view taken along a line B—B in FIG. 5 during an assembly step, and FIG. 8 is an enlarged sectional view taken along a line C—C in FIG. 5 during an assembly step.

DETAILED DESCRIPTION OF THE PREFERRED EMBODIMENT

Figure 1:
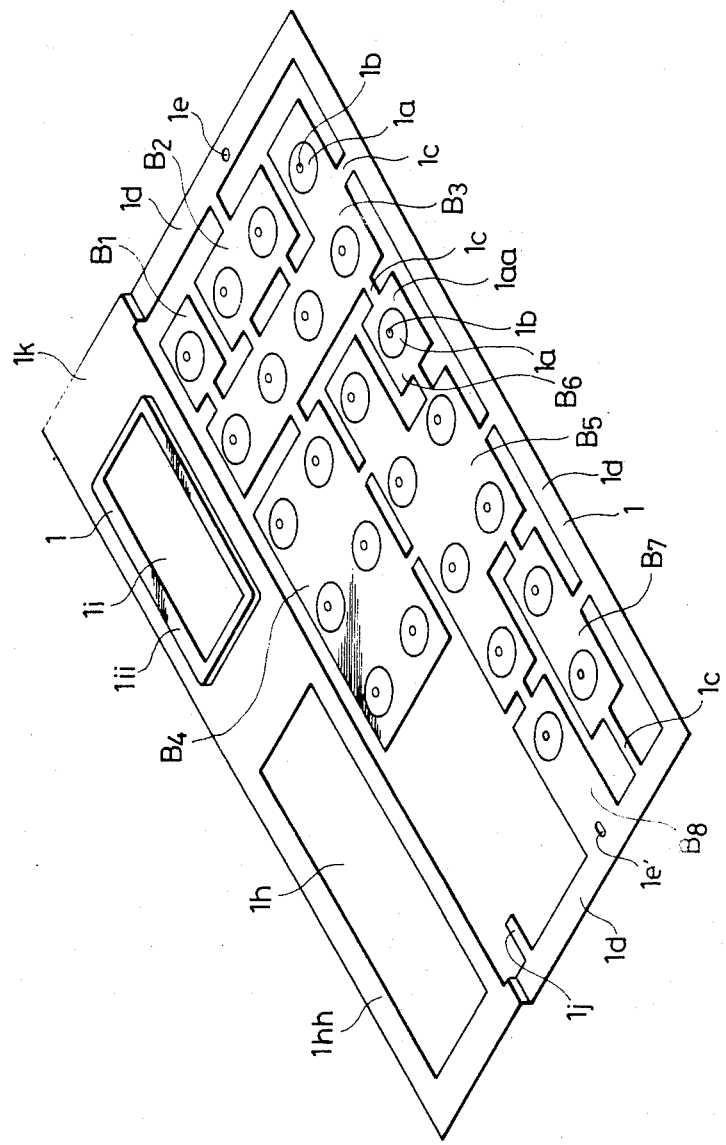
FIG. 1 is a perspective view of a thin metal plate.

FIG. 1 shows a structure of a thin metal plate 1 which is an important element of the present invention.

The thin metal plate 1 is formed from a resilient material such as phosphor-bronze, stainless steel or brass by etching or pressing and it has a thickness of approximately 50–100 $\mu$m.

A key input section of the thin metal plate 1 forms closing means of a key input circuit of a printed circuit board to be described later and it has a plurality of upwardly bulged semi-spherical domes 1a. At a center, that is, an apex of each of the domes 1a, a downward recess 1b is formed. The recess 1b serves as a contact of a movable key contact as will be explained later. Thus, each movable contact is formed by the dome 1a, a periphery 1aa surrounding the dome 1a and the recess 1b.

The domes 1a are integrally formed in one sheet of the thin metal plate 1 and they are divided into contact blocks $B_1$–$B_8$ which are interconnected by narrow connecting areas 1c. Numeral 1d denotes an outer frame which is also connected to the contact blocks by the narrow connecting areas 1c.

Numerals 1e and 1e' denote positioning holes to which positioning pins of a mold are fitted.

On the other hand, an opening 1h for holding a display and an opening 1i for holding a power supply unit such as a solar cell are formed contiguously to the contact blocks of the thin metal plate 1.

Figure 2:
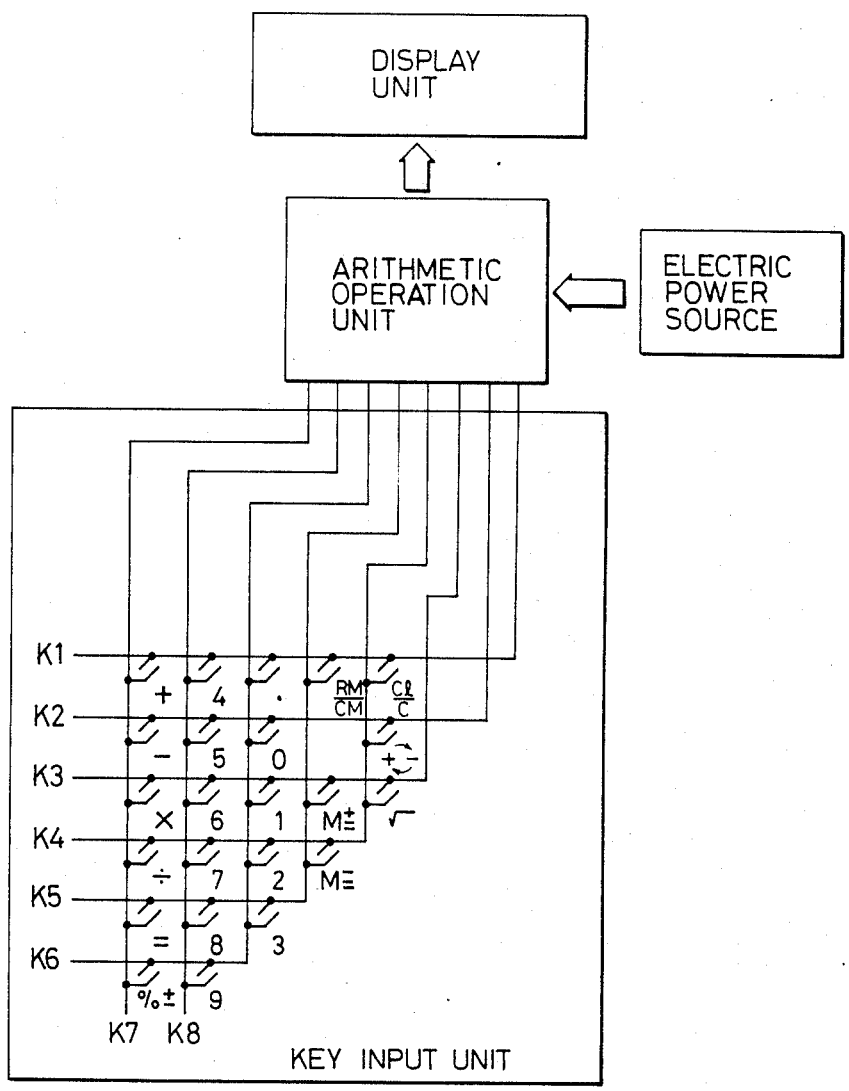
FIG. 2 is a block diagram of a control circuit.

The contact blocks $B_1-B_8$ are bases for supplying key input information to an LSI which performs arithmetic operations of the desk-top calculator. FIG. 2 shows a block diagram of a desk-top calculator as an example of the electronic equipment.

Key input signals in a key input unit of FIG. 2 are produced by shorting any two of signal lines $K_1-K_8$.

For example, when the signal lines $K_4$ and $K_6$ are shorted, a signal is read by an arithmetic operation unit and "1" is displayed on a display unit.

Figure 5:
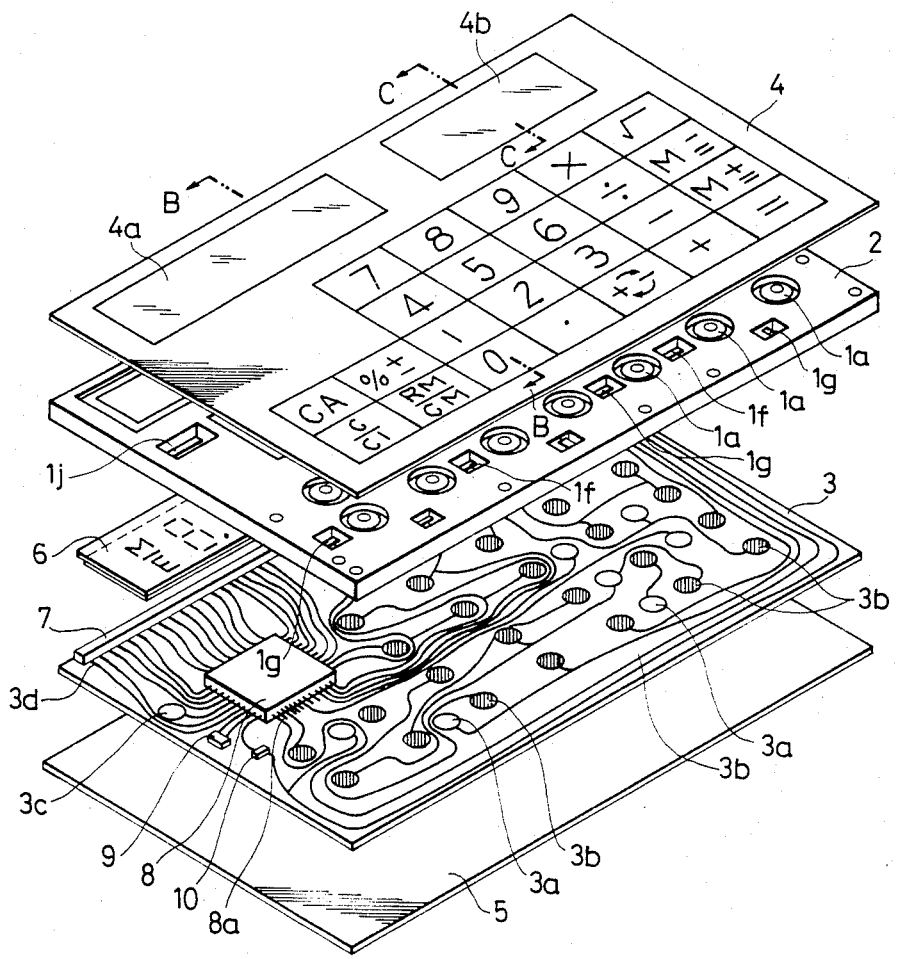
FIG. 5 is an exploded perspective view.

When a desk-top calculator key layout of a cover sheet 4 of a frame 2 shown in FIG. 5 is employed to supply key input signals ".", "0", "1", "2", "3", and "%±" to the arithmetic operation unit, those terminals correspond to the contact block $B_5$ in FIG. 1.

In FIG. 1, "9" is included in the block $B_4$ of the $K_8$ line because of the desk-top calculator key layout.

The contact blocks $B_1-B_8$ of FIG. 1 are configured to minimize the number of the contact blocks on a single side printed circuit board 3 for a pattern of the key input circuit corresponding to the key input unit of FIG. 2.

The thin metal plate 1 having such a structure is insert-molded into a frame body 2' made of insulating high molecular material to form the frame 2.

When the material of the frame body 2' is thermoplastic material such as ABS resin, styrol resin or polycarbonate resin, the thin metal plate 1 is insert-molded by injection molding, and when the material is a thermosetting resin such as epoxy resin or phenol resin, the thin metal plate 1 is insert-molded by compression molding. The insert-molded metal plate is shown in FIG. 3 in which like elements to those shown in FIG. 1 are designated by like numerals and necessary portions of the domes 1a are exposed out of the frame body 2'.

Figure 3:
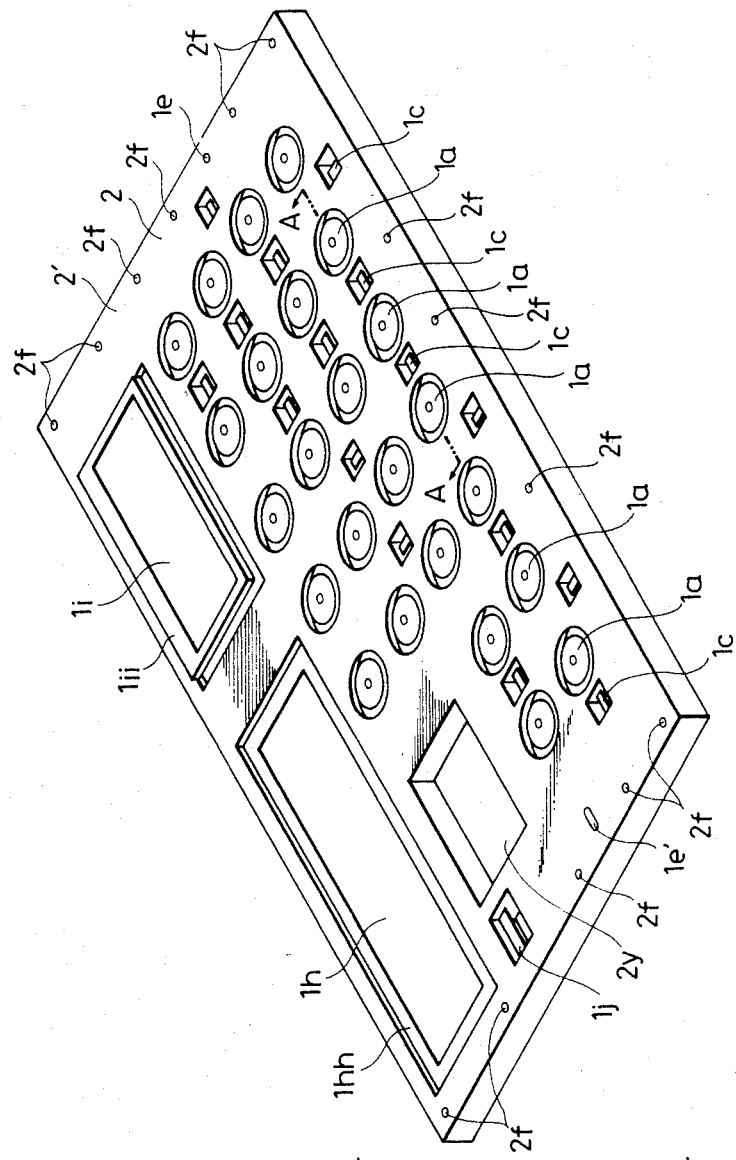
FIG. 3 is a perspective view of a frame having a thin metal plate insert-molded therein.

In FIGS. 1 and 3, numeral 1j denotes a grounding projection for maintaining a ground pattern 3c formed on the printed circuit board 3 shown in FIG. 5 to the same potential as that of the outer frame 1d.

Small holes 2f formed in the outer periphery of the frame 2 are formed by registering the mold having flat-end pins of a small diameter with the thin metal plate 1 in order to position the thin metal plate 1 at the center, thicknesswise, of the frame body 2'. Since the thin metal plate is molded while it is positioned and held in place, the deformation and the shift of the thin metal plate 1 are prevented even when the molding material is filled into the mold at a high pressure.

During the insert molding, the thin metal plate 1 is also held by a flat area of the mold at positions other than those facing the small holes 2f. The thin metal plate 1 is thus held by the mold at all connecting area 1c, at peripheries of all domes 1a and openings 1h and 1i, and at the projection 1j. Because the thin metal plate 1 is uniformly held at a number of positions, it is inserted into the frame body 2' at its exact proper position. The areas to be exposed are exposed by the insert molding and hence it is not necessary to expose them by grinding portions of the frame body. Therefore, the work is very efficient.

Since the exposed areas are held by the mold during the insert molding, they are precisely positioned relative to the frame body. As a result, a key stroke is kept constant and the parts are held precisely.

In the present embodiment, as described above, the projections for holding the parts, the movable contacts and the connecting areas are simultaneously formed by insert molding.

A sectional view of a structure of the frame comprising the frame body 2' and the thin metal plate 1 after insert molding is shown in FIG. 4. As seen from FIG. 4, the top of the dome 1a is substantially flush with the upper surface of the frame 2 and the recess 1b is exposed and the upper and lower surfaces of the connecting area 1c are also exposed. The connecting areas 1c are cut off after the insert molding as shown in FIG. 6 so that the electrical connections between the contact blocks $B_1-B_8$ and the outer frame 1d are broken.

However, as shown in FIG. 6, a connecting area 1g is simply cut off but a connecting area 1f is folded so that it is connected to a contact pattern 3a of the printed circuit board 3.

In this manner, the contact blocks $B_1-B_8$ are connected to the key signal lines on the printed circuit board by at least one folded connecting area 1f.

A rectangular opening 2y shown in FIG. 3 is an opening into which an LSI 8 to be described later is fitted. When the desk-top calculator is assembled as shown in FIG. 5, the LSI 8 is fitted to the opening 2y and the thicknesses of the frame 2 and the LSI 8 are selected such that the upper surface of the LSI 8 is substantially flush with the upper surface of the frame 2. Thus, when the cover sheet 4 is applied to the upper surface of the frame 2, the portion facing the LSI 8 does not project or sink and good appearance is attained and the cover sheet 4 is difficult to tear off. With this construction, the thickness of the desk-top calculator can be reduced to the thickness of the LSI 8.

A developed perspective view of the desk-top calculator assembled by using the frame 2 having the connecting areas 1c cut off is shown in FIG. 5.

In FIG. 5, numeral 4 denotes the cover sheet which is made of transparent material having an appropriate flexibility such as vinyl chloride, polyester, polycarbonate or urethane, and printing is carried on a back surface thereof except in areas for a display window 4a and a window 4b for the solar cell. Key symbol marks are marked on the key area and a desk-top calculator model number or the like is also printed. It is fixedly bonded to the upper surface of the frame 2 in an assembling step.

Numeral 3 denotes the printed circuit board including the key input circuit. It is a single side printed circuit board having a copper laminated plate etched into a predetermined pattern. A plurality of key inputting stationary contacts 3b are formed in one-to-one correspondence to the domes 1a of the frame 2. The ground pattern 3c serves to connect the outer frame 1d to ground potential. It always contacts to the projection 1j formed in the thin metal plate 1 to conduct static electricity discharged from the exterior of the desk-top calculator to the outer frame 1d to prevent the malfunction and the destruction of the LSI 8 by the static electricity.

The LSI 8 is fixed to the printed circuit board 3 by soldering pins thereof and it forms the arithmetic operation unit in the block diagram of FIG. 2.

Electronic parts 9 and 10 such as a resistor and capacitor are also connected to the printed circuit board 3.

Numeral 6 denotes a liquid crystal display which is electrically connected to the connecting pattern 3d on the printed circuit board 3 through a press-contact type connector 7.

Displaced under the printed circuit board 3 is a reinforcing plate 5 made of rigid material, which covers the back surface of the desk-top calculator and is fixedly bonded to the printed circuit board 3 and the periphery of the lower surface of the frame 2 to assure the strength of the entire desk-top calculator. The printed circuit board 3 is a single side printed circuit board and has no circuit pattern on the side bonded with the reinforcing plate 5. Accordingly, the material of the reinforcing plate 5 may be a highly rigid metal. Numeral 11 denotes a polarizing plate.

By stacking various parts as shown in FIG. 5, a very thin desk-top calculator can be constructed. Sectional views of the stacked key input unit and display are shown in FIGS. 6 and 7.

As shown in FIG. 6, the key inputting stationary contact 3b faces the bottom of the recess 1b of the dome 1a of the thin metal plate 1 insert-molded in the frame 2, with a clearance corresponding to the key stroke being left therebetween. The top of the dome 1a contacts the lower surface of the cover sheet 4.

The pattern 3a which is a portion of the key signal line contacts the contact blocks $B_1$-$B_8$ at the folded connecting area 1f. Therefore, the recess 1b is always in contact with the selected key signal line.

As a result, when the cover sheet 4 is depressed by a finger in the direction of an arrow shown in FIG. 6, the cover sheet 4 is flexed, the upper surface of the dome 1a is pressed, the recess 1b descends and compression force is applied to the periphery of the dome 1a. As a result, the pressing load increases as the pressing stroke increases. When the cover sheet 4 is further depressed, the peripheral edge of the dome 1a sinks downward and is flexed. Thus, the compression force changes to a tensile force and the pressing resistance abruptly decreases. Accordingly, to compare with the prior art key input unit which uses a rubber material for key switches, definite pressing feeling (click feeling) is obtained with a shorter stroke.

The bottom of the recess 1b contacts the key inputting stationary contact 3b so that the key input is attained.

The dome 1a of the thin metal plate 1 insert-molded in the frame 2 provides a sufficient resiliency to convey the depression force from the key input area of the cover sheet 4 to the printed circuit board 3 with the click feeling so that excellent key input is attained.

FIG. 7 shows a packaged structure of the display 6. As shown in FIG. 3, the periphery 1hh of the opening 1h of the metal plate 1 which serves to hold the display 6 projects from the frame body 2. This projected area 1hh holds the display 6. The display 6 is connected to the pattern 3d of the printed circuit board 3 through the conductive connector 7.

A packaged structure of the solar cell 12 for supplying a power to the arithmetic operation unit is shown in FIG. 8.

The peripheral projected area 1ii of the opening 1i of the thin metal plate 1 which serves to hold the solar cell 12 is contracted to form a step of a predetermined width as shown in FIG. 1. The amorphous solar cell 12 is held in the contracted area 1k of the opening 1i. The window area 4b of the cover sheet 4 facing the opening 1i has no print applied thereon so that external light is transmitted to the solar cell 12, which generates an electromotive force, which in turn is supplied to the conductive pattern on the printed circuit board 3 through the connector 13.

Unlike the primary cell commonly used in the prior art, the solar cell 12 can be used semipermanently and need not be exchanged. Therefore, the electronic equipment of the invention may be packed in a sealed condition.

In accordance with the present embodiment, the number of parts is significantly reduced, the assembling work is easy and the cost is significantly reduced.

The surface of the desk-top calculator has no unevenness due to the key tops and a flat card type thin desk-top calculator is provided. It can be hermetically sealed for water proof and dust proof, and a portable electronic equipment which is not restricted by an environment of use is provided.

Since the metal plate is inserted over a substantially entire area of the frame 2, the thermal deformation and the poor mechanical strength which are weak points of the high molecular material are compensated for and the strength of the entire desk-top calculator is enhanced.

Since the parts exposed to the outer surface of equipment such as a desk-top calculator are plate-like parts like the display and solar cell, the supply of the parts is easy. They do not need locking parts such as bolts and nuts and hence they can be assembled with an automatic assembly line.

As to the structure of the key input unit, the movable contacts formed by the domes of the thin metal plate are used in spite of the thin desk-top calculator structure. Therefore, clear click feeling is attained and the end of the key input can be sensed by the click feeling through the finger. Accordingly, a high operability of keyboard is provided.

The key inputting movable contacts are divided into blocks one for each key input signal and they are merely contacted to the stationary contacts on the printed circuit board. Accordingly, unlike a conventional bridge system in which the movable contact shorts two key inputting signal patterns on the printed circuit board, the present system can simplify the pattern on the printed circuit board and the pattern can be formed on a single side of the printed circuit board. Accordingly, the present system can input key signals more exactly than the bridge system.

The electronic parts such as the display and solar cell packaged in the frame are fixed by the thin metal plate inserted in the frame. Thus, the strength is assured by the plate thickness which cannot alone be attained by a high molecular material such as synthetic resin.

The present invention is not limited to the above embodiment. While the domes 1a and the recesses 1b are integrally formed with the thin metal plate 1 in the illustrated embodiment, the domes 1a and the recesses 1b may be omitted. In this case, holes are formed in the thin metal plate 1 at the positions corresponding to the domes 1a and the recesses 1b while leaving disc-shaped projections projecting from the frame body, and movable contacts made of conductive rubber are mounted on the projections so that the disc-shaped projections hold the movable contacts and serve as contacts electrically connected to the movable contacts. In any case, the thin metal plate 1 should function as the contacts which are portions of the closing means for closing the key input circuit on the printed circuit board 3.

The reinforcing plate 5 is not always necessary. When it is omitted, the thin metal plate 1 of the frame 2 may serve as the reinforcing plate. Therefore, the thickness of the metal plate may be appropriately changed.

While the thin metal plate is insert-molded to the frame body in the illustrated embodiment, the metal plate may be coated with insulative adhesive material to form the frame.

The present invention is also applicable to equipment other than desk-top calculators, such as teaching machines and game machines. What is claimed is:

1. Electronic equipment comprising:
   a frame body made of high molecular material;
   a metal plate, having substantially the same peripheral shape as said frame body, insert-molded into said frame body to be sandwiched therein thereby to comprise a frame member having upper and lower surfaces, said metal plate being thin and being formed with a plurality of movable contacts divided into a plurality of groups and with a plurality of connection terminals for interconnecting said plurality of groups;
   means having a plurality of key inputting areas for covering said upper surface of said frame member
   printed circuit means having a key input circuit adapted to be closed by a depression force from said key inputting areas; and
   electronic parts connected to said printed circuit means;
   at least a portion of said connection terminals being severed electrically to isolate adjacent groups of said contacts, and at least a portion of said connection terminals being severed and bent continuously to make electrical connection with said printed circuit means;
   said frame member further having convey means for conveying the depression force from said key inputting area to said printed circuit means.

2. Electronic equipment according to claim 1 wherein said metal plate is inserted-molded into said frame body with a portion of said metal plate being directly held by a holder of a mold, wherein said metal plate has a projected portion projecting from said frame body at the portion where said metal plate is held by the holder of the mold, and wherein said projected portion electrically contacts said printed circuit means.

3. An electronic equipment according to claim 2 wherein said projected portion of said metal plate serves to hold said electronic parts.

4. Electronic equipment according to claim 1 wherein said metal plate is insert-molded into said frame body with a portion of said metal plate being directly held by a holder of a mold, wherein said metal plate has a projected portion projecting from said frame body at the portion where said metal plate is held by the holder of the mold, and wherein said projected portion is formed by severing at least one said connection terminal and bending it, said projected portion electrically contacting said printed circuit means.

5. Electronic equipment comprising:
   a frame body made of high molecular material and having upper and lower surfaces;
   a metal plate having substantially the same peripheral shape as and being integrally sandwiched within said frame body between said upper and lower surfaces thereby to comprise a frame member;
   means having a plurality of key inputting areas covering said upper surface of said frame member;
   printed circuit means having a key input circuit adapted to be closed by application of a depression force to said key inputting areas; and
   electronic components connected to said key input circuit actuated by closure thereof; said frame member further including conveying means for conveying a depression force from said key inputting areas to said printed circuit means; said metal plate including a plurality of projecting portions projecting from said frame body and supported by a mold support during the insert-molding operation; at least some of said projecting portions being severed electrically to isolate adjacent parts of said metal plate and at least some of said projecting portions being severed and bent continuously to make electrical connection with said printed circuit means.

6. Electronic equipment having a key input function comprising:
   printed circuit means having an open key input circuit; and
   a frame member having means for closing said key input circuit, said frame member comprising a frame body made of insulative high molecular material and a metal plate insert-molded within said frame body, at least one portion of said metal plate defining said closing means and which may be supported directly by a mold support during the insert-molding operation;
   said frame member further comprising a plurality of projections including a portion of said metal plate, other than said closing means, formed by being directly supported by a mold support during the insert-molding operation; at least some of said projections being severed electrically to isolate adjacent parts of said metal plate and at least some of said projections being severed and bent continuously to make contact with said printed circuit means.

* * * * *